(12) United States Patent
Cao

(10) Patent No.: US 7,598,811 B2
(45) Date of Patent: Oct. 6, 2009

(54) CURRENT-CONTROLLED CMOS (C3MOS) FULLY DIFFERENTIAL INTEGRATED WIDEBAND AMPLIFIER/EQUALIZER WITH ADJUSTABLE GAIN AND FREQUENCY RESPONSE WITHOUT ADDITIONAL POWER OR LOADING

(75) Inventor: Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 533 days.

(21) Appl. No.: 11/320,398

(22) Filed: Dec. 28, 2005

(65) Prior Publication Data

US 2007/0025435 A1 Feb. 1, 2007

Related U.S. Application Data

(60) Provisional application No. 60/704,134, filed on Jul. 29, 2005.

(51) Int. Cl.
*H03F 3/191* (2006.01)
*H03F 3/45* (2006.01)
(52) U.S. Cl. .................. 330/304; 330/254; 330/260
(58) Field of Classification Search ................ 330/253, 330/254, 304, 259, 260
See application file for complete search history.

(56) References Cited

U.S. PATENT DOCUMENTS

| | | | |
|---|---|---|---|
| 3,569,732 | A | 3/1971 | Christensen |
| 4,333,020 | A | 6/1982 | Maeder |
| 4,395,774 | A | 7/1983 | Rapp |
| 4,449,248 | A | 5/1984 | Leslie et al. |
| 4,519,068 | A | 5/1985 | Krebs et al. |
| 4,545,023 | A | 10/1985 | Mizzi |
| 4,599,526 | A | 7/1986 | Paski |
| 4,649,293 | A | 3/1987 | Ducourant |
| 4,680,787 | A | 7/1987 | Marry |
| 4,727,309 | A | 2/1988 | Vajdic et al. |

(Continued)

FOREIGN PATENT DOCUMENTS

EP    0685933    6/1995

(Continued)

OTHER PUBLICATIONS

Buhanan, "CML and Flip TAB Joint Forces in the DPS 88's Micropackages," Electronics, (Nov. 3, 1982).

(Continued)

*Primary Examiner*—Khanh V Nguyen
(74) *Attorney, Agent, or Firm*—Garlick Harrison & Markison; Shayne X. Short

(57) ABSTRACT

Current-controlled CMOS (C3MOS) fully differential integrated wideband amplifier/equalizer with adjustable gain and frequency response without additional power or loading. A novel approach is presented by which adjustable amplification and equalizer may be achieved using a C3MOS wideband data stage. This may be referred to as a C3MOS wideband data amplifier/equalizer circuit. This employs a wideband differential transistor pair that is fed using two separate transistor current sources. A switchable RC network is communicatively coupled between the sources of the individual transistors of the wideband differential transistor pair. There are a variety of means by which the switchable RC network may be implemented, including using a plurality of components (e.g., capacitors and resistors connected in parallel). In such an embodiment, each component may have an individual switch to govern its connectivity in the switchable RC network thereby allowing a broad range of amplification and equalization to be performed.

20 Claims, 12 Drawing Sheets

U.S. PATENT DOCUMENTS

| | | |
|---|---|---|
| 4,731,796 A | 3/1988 | Masterson et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,806,796 A | 2/1989 | Bushey et al. |
| 4,807,282 A | 2/1989 | Kazan et al. |
| 4,817,115 A | 3/1989 | Campo et al. |
| 4,850,009 A | 7/1989 | Zook et al. |
| 4,890,832 A | 1/1990 | Zomaki |
| 4,894,792 A | 1/1990 | Mitchell et al. |
| 4,916,441 A | 4/1990 | Gombrich |
| 4,964,121 A | 10/1990 | Moore |
| 4,969,206 A | 11/1990 | Desrochers |
| 4,970,406 A | 11/1990 | Fitzpatrick et al. |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyaski |
| 5,033,109 A | 7/1991 | Kawano et al. |
| 5,041,740 A | 8/1991 | Smith |
| 5,055,659 A | 10/1991 | Hendrick et al. |
| 5,055,660 A | 10/1991 | Bertagna et al. |
| 5,079,452 A | 1/1992 | Lain et al. |
| 5,081,402 A | 1/1992 | Koleda |
| 5,087,099 A | 2/1992 | Stolarczyk |
| 5,115,151 A | 5/1992 | Hull et al. |
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,177,378 A | 1/1993 | Nagasawa |
| 5,179,721 A | 1/1993 | Comroe et al. |
| 5,181,200 A | 1/1993 | Harrison |
| 5,196,805 A | 3/1993 | Beckwith et al. |
| 5,216,295 A | 6/1993 | Hoang |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,247,656 A | 9/1993 | Kabuo et al. |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mbey et al. |
| 5,289,055 A | 2/1994 | Razavi |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,301,196 A | 4/1994 | Ewen et al. |
| 5,323,392 A | 6/1994 | Ishii et al. |
| 5,331,509 A | 7/1994 | Kikinis |
| 5,345,449 A | 9/1994 | Buckingham et al. |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,406,615 A | 4/1995 | Miller, II et al. |
| 5,406,643 A | 4/1995 | Burke et al. |
| 5,418,837 A | 5/1995 | Johansson et al. |
| 5,420,529 A | 5/1995 | Altmann et al. |
| 5,423,002 A | 6/1995 | Hart |
| 5,426,637 A | 6/1995 | Derby et al. |
| 5,428,636 A | 6/1995 | Meier |
| 5,430,845 A | 7/1995 | Rimmer et al. |
| 5,434,518 A | 7/1995 | Sinh et al. |
| 5,438,329 A | 8/1995 | Gastouniotis et al. |
| 5,440,560 A | 8/1995 | Rypinski |
| 5,457,412 A | 10/1995 | Tamba et al. |
| 5,459,412 A | 10/1995 | Mentzer |
| 5,465,081 A | 11/1995 | Todd |
| 5,481,265 A | 1/1996 | Russell |
| 5,481,562 A | 1/1996 | Pearson et al. |
| 5,510,734 A | 4/1996 | Sone |
| 5,510,748 A | 4/1996 | Erhart et al. |
| 5,521,530 A | 5/1996 | Yao et al. |
| 5,533,029 A | 7/1996 | Gardner |
| 5,535,373 A | 7/1996 | Oinowich |
| 5,544,222 A | 8/1996 | Robinson et al. |
| 5,548,230 A | 8/1996 | Gerson et al. |
| 5,576,644 A | 11/1996 | Pelella |
| 5,579,487 A | 11/1996 | Meyerson et al. |
| 5,584,048 A | 12/1996 | Wieczorek |
| 5,600,267 A | 2/1997 | Wong et al. |
| 5,606,268 A | 2/1997 | Van Brunt |
| 5,614,841 A | 3/1997 | Marbot et al. |
| 5,625,308 A | 4/1997 | Matsumoto et al. |
| 5,628,055 A | 5/1997 | Stein |
| 5,630,061 A | 5/1997 | Richter et al. |
| 5,640,356 A | 6/1997 | Gibbs |
| 5,675,584 A | 10/1997 | Jeong |
| 5,680,633 A | 10/1997 | Koenck et al. |
| 5,708,399 A | 1/1998 | Fujii et al. |
| 5,724,361 A | 3/1998 | Fiedler |
| 5,732,346 A | 3/1998 | Lazaridis et al. |
| 5,740,366 A | 4/1998 | Mahany et al. |
| 5,744,366 A | 4/1998 | Kricka et al. |
| 5,767,699 A | 6/1998 | Bosnyak et al. |
| 5,796,727 A | 8/1998 | Harrison et al. |
| 5,798,658 A | 8/1998 | Werking |
| 5,821,809 A | 10/1998 | Boerstler et al. |
| 5,839,051 A | 11/1998 | Grimmett et al. |
| 5,877,642 A | 3/1999 | Takahashi |
| 5,892,382 A | 4/1999 | Ueda et al. |
| 5,903,176 A | 5/1999 | Westgate |
| 5,905,386 A | 5/1999 | Gerson |
| 5,940,771 A | 8/1999 | Golnick et al. |
| 5,945,847 A | 8/1999 | Ransijn |
| 5,945,858 A | 8/1999 | Sato |
| 5,945,863 A | 8/1999 | Coy |
| 5,969,556 A | 10/1999 | Hayakawa |
| 6,002,279 A | 12/1999 | Evans et al. |
| 6,014,041 A | 1/2000 | Somasekhar et al. |
| 6,014,705 A | 1/2000 | Koenck et al. |
| 6,028,454 A | 2/2000 | Elmasry et al. |
| 6,037,841 A | 3/2000 | Tanjii et al. |
| 6,037,842 A | 3/2000 | Bryan et al. |
| 6,038,254 A | 3/2000 | Ferraiolo et al. |
| 6,060,951 A | 5/2000 | Inoue |
| 6,061,747 A | 5/2000 | Ducaroir et al. |
| 6,081,162 A | 6/2000 | Johnson |
| 6,094,074 A | 7/2000 | Chi |
| 6,104,214 A | 8/2000 | Ueda et al. |
| 6,111,425 A | 8/2000 | Bertin et al. |
| 6,114,843 A | 9/2000 | Olah |
| 6,188,339 B1 | 2/2001 | Hasegawa |

| | | | |
|---|---|---|---|
| 6,194,950 B1 | 2/2001 | Kibar et al. | |
| 6,222,380 B1 | 4/2001 | Gerowitz et al. | |
| 6,232,844 B1 | 5/2001 | Talaga, Jr. | |
| 6,259,312 B1 | 7/2001 | Murtojarvi | |
| 6,259,321 B1 | 7/2001 | Song et al. | |
| 6,265,898 B1 | 7/2001 | Bellaouar | |
| 6,310,501 B1 | 10/2001 | Yamashita | |
| 6,366,166 B1 | 4/2002 | Belot | |
| 6,374,311 B1 | 4/2002 | Mahany et al. | |
| 6,414,558 B1 | 7/2002 | Ryan et al. | |
| 6,417,737 B1 | 7/2002 | Moloudi et al. | |
| 6,424,194 B1 | 7/2002 | Hairapetian | |
| 6,463,092 B1 | 10/2002 | Kim et al. | |
| 6,566,720 B2 | 5/2003 | Aldrich | |
| 6,624,699 B2 * | 9/2003 | Yin et al. | 330/260 |
| 6,664,853 B1 * | 12/2003 | Sun et al. | 330/253 |
| 6,774,721 B1 | 8/2004 | Popescu et al. | |
| 6,864,558 B2 | 3/2005 | Momtaz et al. | |
| 6,911,857 B1 | 6/2005 | Stiff | |
| 2002/0017921 A1 | 2/2002 | Green | |
| 2003/0034843 A1 | 2/2003 | Fanous et al. | |
| 2004/0104746 A1 | 6/2004 | Kim et al. | |
| 2005/0015638 A1 | 1/2005 | Zhang | |
| 2005/0093628 A1 | 5/2005 | Chen | |
| 2005/0110525 A1 | 5/2005 | Chen | |

FOREIGN PATENT DOCUMENTS

| | | |
|---|---|---|
| EP | 1 306 970 A2 | 6/2002 |
| EP | 1420511 A | 5/2004 |
| WO | WO 81/01780 | 6/1981 |
| WO | WO 0163767 | 8/2001 |

OTHER PUBLICATIONS

Chu et al.: "A comparison of CMOS circuit techniques: Differential cascode voltage switch logic versus conventional logic" IEEE Journal of Solid-State Circuits, vol. SC-22(4) pp. 528-532, (Aug. 1987).
Gray et al., "Analysis and Design of Analog Integrated Circuits," John Wiley Sons, Inc., pp. 704-709, (1977).
Harrold, "An Introduction to GaAs IC Design," Prentice Hall International, UK Ltd., pp. 43-45, 63, 160, (1993).
Heller et al.: "Cascade voltage switch logic: A differential CMOS logic family", IEEE International Solid-State Circuits Conference, pp. 16-17 (Feb. 22, 1984).
Hodges et al., "Analysis and Design of Digital Integrated Circuits." McGraw Hill, Inc., pp. 271-283, (1983).
Katsu et al., "A GaAs Monolithic Frequency Divider Using Source Coupled FET Logic," IEEE Electron Device Letters,vol. EDL-3, No. 8, (Aug.11982).
Katsu et al., "A Source Coupled FET Logic-A New Current-Mode Approach to GaAs Logics," IEEE Transactions on Electron Devices, vol. ED-32, No. 6, (Jun. 1985).
Lee, T. "The Design of CMOS Radio-Frequency Integrated Circuits," 1998, Cambridge Press, New York, N.Y., pp. 178-185.
Pfennings et al.: "Differential split-level CMOS logic for subnanosecond speeds", IEEE Journal of Solid-State Circuits, vol. SC-20(5), pp. 1050-1055, (Oct. 1985).
Rudell. J. et al., "A 1.9-GHz Wide-Band IF Double Conversion CMOS Receiver for Cordless Telephone Applications" IEEE Journal of Solid State Circuits, vol. 32(12) , pp. 2071-2088, Dec. 1997.
Somasekhar and Kaushik, "Differential current switch logic a power DCVS logic family" IEEE Journal of SolidState Circuits, vol. 31(7), pp. 981-991, (Jul. 1996).
Yamashina and Yamada, "An MOS current mode logic (MCML) Circuits for low-power Sub-GHz Processors" IEICE Trans. Electron., vol. E75-C(10) pp. 1181-1187, (Oct. 1992).
Yamashina and Yamada, "An MOS current mode logic (MCML) Circuit for low-power Sub-GHz Processors" NEC Res. Develop., vol. 36(1), pp. 54-63, (Jan. 1995).
Bida, A Hybrid Wireless MAC Protocol Supporting Asynchronous and Synchronous MSDU Delivery Services, IEEE 802.11191-92, Sep. 1991, pp. 1-46.

Robert Meier's Master's Thesis, Mobile Computer Network Architecture, (May 1993), 82 pages.
Hoberecht, A Layered network Protocol for Packet Voice and Data Integration, IEEE Journal on Selected Areas in Communications, vol. SAC-1, No. 6 (Dec. 1983), pp. 1006-1013.
Rypinski, Architecture-Topology and Protocol Stacks, IEEE 802.11191-21, Mar. 1991, 12 pages.
Cheah, A Proposed Architecture and Access Protocol Outline for the IEEE 802.11 Radio LAN Standards, Document IEEE P802.11191-54, May 1991; pp. 1-20.
Rypinski, Power-Drain Considerations for Full Time and Sleep Mode Radio Receivers, IEEE P802.11191-99, Sep. 1991, 11 pages.
Natarajan et al, Battery Efficient Operation of Radio MAC Protocol, IEEE P802.11191-102, Sep. 1991, pp. 1-5.
Cox, A Radio System Proposal for Widespread Low-Power Tetherless Communications, IEEE Transactions on Communications, vol. 39, No. 2 (Feb. 1991), pp. 324-335.
Bagby, One Approach to Wireless Network Architecture, IEEE P802.11191-2, Jan. 1991, 1-15, 17-21.
Biba, A Modest Proposal for a Asynchronous, Data Intensive, Wireless Local Area Network, IEEE P802.11191-25, Mar. 1991; pp. 1-25.
Heimschi et al; Merged CMOS/Bipolar Current Switch Logic (MCSL), IEEE Journal of Solid State Circuits, vol. 24, pp. 1307-1311, Oct. 1989.
Elrabaa et al; Optimization of Digital BiCMOS Circuits, an Overview, IEEE 1992, 5 pages.
Mudd et al, Very High Speed ECLICMG Gate Arrays with Submicron Structures; IEEE 1989, 5 pages.
Mizuno, et al., "A GHZ MOS Adaptive Pipeline Technique Using MOS Current-Mode Logic," IEEE Journal of Solid-State Circuits, vol. 31, No. 6, pp. 784-791, (Jun. 1996).
Yamashina, et al., "A Low-Supply Voltage GHz MOS Integrated Circuit for Mobile Computing Systems," IEEE Symposium on Low Power Electronics. pp. 8CL81, (1994). Atkinson, A Single Chip Radio Transceiver for DECT, IEEE 1997.
Mizuno, A GHzMOS Adaptive Pipeline Technique Using MOS Current-Mode Logic, IEEE Journal of SolidState Circuits, vol. 31, No. 6, pp. 784-791 (Jun. 1996).
Heimsch, Merged CMOSIBipolar Current Switch Logic (MCSL), IEEE Journal of SolidState Circuits, vol. 24, No. 5, pp. 1307-1311 (Oct. 1989).
Elrabaa, Optimization of Digital BiCMOS Circuits, An Overview, IEEE 1992.
Elrabaa, Multimitter BiCMOS CML Circuits, IEEE Journal of Solid-State Circuits, vol. 27, No. 3, pp. 454-458 (Mar. 1992).
Ewen et al., Single-Chip 1062Mbaud CMOS Transceiver for Serial Data Communication, 1995 IEEE International Solid-State Circuits Conference Digest of Technical Papers, pp. 32-33, 336.
Chen and Waldron, A Single-Chip 266MbIs CMOS TransmitterlReceiver for Serial Data Communications, 1993 IEEE International Solid-State Circuits Conference Digest of Technical Papers, pp. 100-101, 269.
Oshima et al., A Single CMOS SDH Terminal Chip for 622 MbIs STM 4C, 1994 IEEE International SolidState Circuits Conference Digest of Technical Papers, pp. 174-175.
Widmer et al., Single-Chip 4xSOOMbaud CMOS Transceiver, 1996 IEEE International SolidState Circuits Conference Digest of Technical Papers, pp. 126-127, 430.
Lee et al., A CMOS Serial Link for 1 Gbaud Fully Duplexed Data Communication, 1994 Symposium on VLSI Circuits Digest of Technical Papers, pp. 125-126.
Lee et al., A CMOS Serial Link for Fully Duplexed Data Communication, IEEE Journal of Solid-State Circuits, vol. 30, pp. 353-364 (Apr. 1995).
Djahanshahi et al., High-speed ECL-Compatible Serial I/0 in 0.35μm CMOS, IEEE 1998.
Fukaishi et al., A 4.25-GbIs CMOS Fiber Channel Transceiver with Asynchronous Tree-Type Demultiplexer and Frequency Conversion Architecture, IEEE Journal of Solid-state Circuits, vol. 33 No. 12, pp. 2139-2147 (1998).
Madhavan and Levi, Low-Power 2.5 Gbitls VCSEL driver in 0.5μm CMOS technology, Electronics Letters, vol. 34 No. 2 pp. 178-179 (Jan. 1998).

Chen and Barker, A 1.25Gb/s, 460mW CMOS Transceiver for Serial Data Communication, 1997 IEEE International Solid-state Circuits Conference pp. 242-243, 465.

Runge and Thomas, 5Gbit/s 2:1 multiplexer fabricated in 0.35μm CMOS and 3Gbit/s 1:2 demultiplexer fabricated in 0.5μm CMOS technology, Electronics Letters, vol. 35 No. 19.pp. 163 1-33 (Sep. 1999).

Fiedler et al., A 1.0625Gbps Transceiver with 2x-Oversampling and Transmit Signal Pre-Emphasis, 1997 IEEE International Solid- state Circuits Conference pp. 238-239,464.

Widmer et al., Single-Chip 4x50CLMEd CMOS Transceiver, IEEE Journal of Solid-state Circuits, vol. 31 No. 12 pp. 2004-2014 (1996).

Kurisu et al., 2.8Gb/s 176mW Byte-Interleaved and 3.0 Gbls 118mW Bit-Interleaved 8:1 Multiplexers, 1996 International Solid state Circuits Conference pp. 122-123, 429.

Friedman et al, A Baseband Processor for IS-54 Cellular Telephony, IEEE Journal of Solid-state Circuits, vol. 31 No. 5 pp. 646-655 (May 1996).

Ewen et al., CMOS circuits for Gbls serial data communication, IBM J. Res. Develop., vol. 39 No. 12 pp. 73-81 (Mar. 1995).

Thompson et al., A 300-MHz BiCMOS Serial Data Transceiver, IEEE Journal of Solid-state Circuits, vol. 29 No. 3 pp. 185-192 (1994).

Yuen et al., an ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbitls Bandwidth MultiplexerfDemultiplexer CMOS Chip, 1992 Symposium on VLSI Circuits Digest of Technical Papers pp. 68-69.

Navarro and Van Noije, Design of an 8:1 MUX at 1.7Gbit/s in 0.8μm CMOS Technology, 1998 Great Lakes Symposium on VLSI.

Pederson and Metz, A CMOS to lOOK ECL Interface Circuit, 1989 IEEE International Solid-state Circuits Conference pp. 226-227, 345.

Baumert et al., A Monolithic 50-200 MHz CMOS Clock Recovery and Retiming Circuit, IEEE 1989 Custom Integrated Circuits Conference pp. 14.5.1-14.5.4, (May 1989).

Atkinson, A Single Chip Radio Transceiver for DECT, IEEE 1997.

Klose, Process-Optimization for Sub-30ps BiCMOS Technologies for Mixed ECLICMOS Applications, IEEE 1991.

Leung D L C et al.: "A 3-V CMOS differential bandpass amplifier for GSM receivers" Circuits and Systems, 1998. ISCAS '98. Proceedings of the 1998 IEEE International Symposium on Monterey, CA, USA May 31 -Jun. 3, 1998, New York, NY, USA, IEEE, US, May 31, 1998, pp. 341-344, XPO10289447 ISBN: 0-7803-4455-3 *figure 5*.

Qiang Li et al Institute of Electrical and Electronics Engineers: "RF circuit performance degradation due to soft breakdown and hot carrier effect in 0.18 /sp mμ/m CMOS technology"2001 IEEE Radio Frequency Integrated Circuits (RFIC). Symposium. Digest of Papers. Phoenix, AZ, May 20-22, 2001. IEEE Radio Frequency Integrated Circuits Symposium, New York, NY : IEEE. US, May 20, 2001. pp. 139-142, XP010551339 ISBN: 0-7803-6601-8 * figure 3*.

Razavi B ED-Institute of Electrical and Electronics Engineers: "Prospects Of CMOS Technology For High-Speed Optical Communication Circuits" GaAs IC symposium. 23rd. Annual IEEE Gallium Arsenide Integrated Circuit Symposium. Technical digest 2001. Baltimore, MD, Oct. 21-24, 2001, GaAs IC Symposium-IEEE Gallium Arsenide Integrated Circuit Symposium, New York, NY IEEE, US, Oct. 21, 2001, pp. 3-6, XP001O46946 ISBN: 0-7803-6663-8 * figures 6a,7.

Li Q et al: "RF Circuit Performance Degradation Due to Soft Breakdown and Hot-Carrier Effect in Deep-Submicrometer CMOS Technology" IEEE Transactions on Microwave Theory and Techniques, IEEE Inc. New York, US. vol. 49, No. 9, Sep. 2001, pp. 1546-1551, XP001096604 ISSN: 0018-9480 *figure 9*.

Masakazu Yamashina, Masayuki Mizuno, Koichiro Furuta, Hiroyuki Igura, Masahiro Nomura, Hiroshi Abiko, Kazuhiro Okabe, Atsuki Ono and Hachiro Yamada, "A Low Supply Voltage GHz MOS Integrated Circuit for Mobile Computing Systems," IEEE Symposium On Low Power Electronics, XP002386133, Oct. 1994, pp. 80-81.

European Search Report; EP06008842.4-2215, dated Jun. 22, 2009.

* cited by examiner

CURRENT-CONTROLLED CMOS (C3MOS) FULLY DIFFERENTIAL INTEGRATED WIDEBAND AMPLIFIER/EQUALIZER WITH ADJUSTABLE GAIN AND FREQUENCY RESPONSE WITHOUT ADDITIONAL POWER OR LOADING

CROSS REFERENCE TO RELATED PATENTS/PATENT APPLICATIONS

Provisional Priority Claims

The present U.S. Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/704,134, entitled "Current-controlled CMOS (C3MOS) fully differential integrated wideband amplifier/equalizer with adjustable gain and frequency response without additional power or loading," filed Friday, Jul. 29, 2005.

Incorporation by Reference

The following U.S. Utility Patent Applications are hereby incorporated herein by reference in their entirety and made part of the present U.S. Utility Patent Application for all purposes:

1. U.S. patent application Ser. No. 09/484,856, entitled "Current-controlled CMOS logic family," filed Jan. 18, 2000, now U.S. Pat. No. 6,424,194 B1, issued Jul. 23, 2002.

2. U.S. patent application Ser. No. 09/610,905, entitled-"Current-controlled CMOS circuits with inductive broadbanding," filed Jul. 6, 2000, now U.S. Pat. No. 6,340,899 B1, issued Jan. 22, 2002.

3. U.S. patent application Ser. No. 10/028,806, entitled-"Current-controlled CMOS wideband data amplifier circuits," filed Oct. 25, 2001, now U.S. Pat. No. 6,624,699 B2, issued Sep. 23, 2003.

BACKGROUND OF THE INVENTION

1. Technical Field of the Invention

The invention relates generally to the communication devices; and, more particularly, it relates to the field of amplification and equalization that may be implemented within such communication devices.

2. Description of Related Art

High speed circuit techniques such as current-controlled CMOS (or C3MOS) logic have been developed that have brought about marked increase in the speed of circuitry fabricated using standard CMOS process technology.

To enable a communication system to adapt to various input data communication channel types, it is highly desirable for a wideband data amplifier to be able to provide both a flat frequency response as well to provide high-pass responses with different levels of boost. In another implementation (U.S. Patent Application Publication Number: 20040028158), two separate data paths are provided for the input data: (1) one having a flat frequency response and (2) the other having a high-pass frequency response. The signals, after having passed through the two different paths, are then combined together at a summing stage. The relative strength of the two paths can be adjusted and thus enable the overall data path to have a high-pass response with different level of boost and high frequency. When the high-pass path is completely turned off, a flat frequency response can be obtained.

FIG. 1 illustrates a prior art two path embodiment 100 of an adjustable amplifier/equalizer. For transmission rates of 10 Gbps (Giga-bits per second) or higher, the data amplifier or equalizer generally consume a significant amount of power. In the two-path approach for adjustable equalization, three high-speed blocks needs to be powered up (i.e., a flat gain stage 110, a high-pass gain stage 120, and control 130 that is operable to control each of the flat gain stage 110 and the high-pass gain stage 120). If the summer is included in this consideration, then three high-speed blocks are employed. The summer is especially power hungry because it has two pairs of full-rate data input. This adds a significant amount of parasitic loading to the high speed data path.

Further more, the input data are connected to both the flat gain stage 100 and the high-pass gain filter stage 120. If this combined input signal (i.e., which is provided to both the flat gain stage 100 and the high-pass gain filter stage 120) is connected to the output of a front buffer, then this configuration significantly increases the loading to the previous stage. This has the undesirable effect and deleterious effect of reducing the bandwidth of the data path. Moreover, if the combined input is connected to the input pads of the receiver directly, it will cause a severe degradation of the impedance matching (i.e., will cause a severe impedance mis-match) between the input of the receiver and the traces on the PCB (Printed Circuit Board) due to the excessive capacitance loading. This results in even more undesirable and deleterious effects due to the large amount of reflections, and this significantly degrades the integrity of the input data. Another potential issue and problem of this prior art two path embodiment 100 is when the signals that pass through the two different paths are ultimately combined together at the summer, it may generate addition jitter if the delay between the two path differs significantly. As can be seen, while this prior art two path embodiment 100 does provide at least one solution to having an adjustable gain and equalizer stage, it has significant limitations. More specifically, among other problems, this prior art two path embodiment 100 significantly power consumptive, it may introduce undesirable impedance matches, and it may require great care be taken to ensure the two paths have substantially similar delays.

Cleary, there still exists a need in the art for a solution for an adjustable combined amplifier/equalizer stage accommodate various data channels while not increasing the power and loading, and not introducing many of the undesirable and deleterious effects generated by the prior art two path embodiment 100 described above.

From the above discussions, it is highly desirable to have an adjustable combined amplifier/equalizer stage accommodate various data channels while not increasing the power and loading.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become

DETAILED DESCRIPTION OF THE INVENTION

Figure 1:
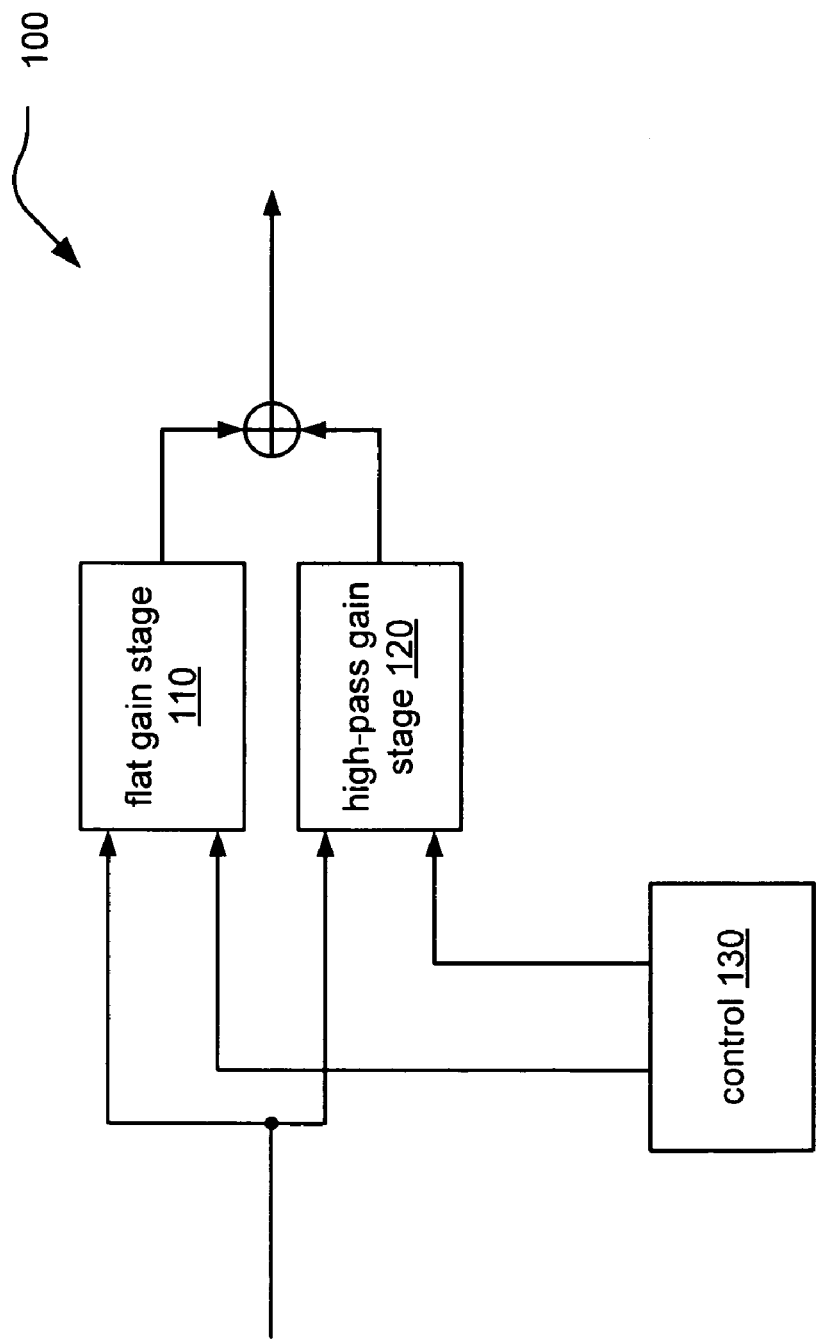
FIG. 1 illustrates a prior art two path embodiment of an adjustable amplifier/equalizer.

Various embodiments of the invention provide for ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. Embodiments of the invention use current-controlled mechanisms to develop a family of very fast current-controlled CMOS (C3MOS or C³MOS™) logic that can be fabricated using a variety of conventional CMOS process technologies, but that unlike conventional CMOS logic does dissipate static current. C3MOS logic or current-controlled metal-oxide-semiconductor field-effect transistor (MOSFET) logic are used herein interchangeably.

Various C3MOS circuit techniques are described in greater detail in commonly-assigned U.S. patent application Ser. No. 09/484,856, now U.S. Pat. No. 6,424,194 B1, entitled "Current Controlled CMOS Logic Family," by A. Hairapetian, which is hereby incorporated by reference in its entirety for all purposes as indicated above.

Other techniques have been developed to increase the gain-bandwidth product of CMOS circuitry. For example, shunt peaking is one approach that has resulted in improved gain-bandwidth product. Shunt peaking involves putting an inductor in series with the output resistor to expand the bandwidth of the circuit. Such inductive broadbanding technique combined with C3MOS circuitry has been described in greater detail in commonly-assigned U.S. patent application Ser. No. 09/610,905, now U.S. Pat. No. 6,340,899 B1, entitled "Current-Controlled CMOS Circuits with Inductive Broadbanding," by M. Green, which is hereby incorporated by reference in its entirety for all purposes as indicated above.

The expansion of the gain-bandwidth product brought about by such inductive peaking, however, is limited to about 1.5 times, and the inductors needed are generally large which requires a large area on an integrated circuit. In wideband data communications, the usable data frequency range starts at several kHz (kilo-Hertz) and extends all the way up to many GHz (Giga-Hertz). A wideband amplifier is required to handle such a broad spectrum of data frequencies. This is in contrast to the wireless domain where communications occurs only over a narrow band, which can be accomplished using a-tuned amplifier with an inductor and a capacitor. However, a relatively constant or flat frequency response is desired over a wide frequency band in a wideband data amplifier.

Typically, in designing a wideband amplifier there is a trade off between gain and bandwidth. The product of gain and bandwidth is usually a constant for the same topology. However, by using special techniques, bandwidth can be extended while maintaining the same gain level. One conventional way is to employ a faster process technology, such as GaAs or InP when fabricating integrated circuits upon which the wideband data amplifier is implemented. However, these technologies are generally more costly and not as widely available as standard CMOS process.

Nevertheless, high speed wideband data amplifiers are needed and are used in wideband data communication applications. For a number of reasons including speed limitations of processing technology, power consumption and other cost related concerns, it is desirable to develop efficient techniques to boost the amplifier bandwidth for higher frequency operations. For example, due to process speed limitation, for power saving reason, and for other reasons, people are seeking efficient techniques to boost the amplifier bandwidth to extend the capability of a certain process and power budget. If the input data goes through a high bandwidth channel, and thus contain only a small amount of data dependent jitter or inter-symbol interference (ISI), it is desirable for the data amplifier to have a flat frequency response over a very wide frequency range.

In commonly-assigned U.S. patent application Ser. No. 10/028,806, now U.S. Pat. No. 6,624,699 B2, entitled "Current-controlled CMOS wideband data amplifier circuits," by Guangming Yin and Jun Cao, which is hereby incorporated by reference in its entirety for all purposes as indicated above, the current-controlled CMOS wideband data amplifier circuits disclosed therein having expanded bandwidth are designed to achieve such the goal of having a flat frequency response over a very wide frequency range, where maximum bandwidth expansion is achieved by using series inductor peaking with Miller capacitance cancellation technique and shunt inductor peaking in current controlled CMOS (C3MOS or Current-controlled CMOS wideband data amplifier circuits) circuits.

However, if the physical communication channel through which the input data passes is severely bandwidth limited (e.g., because of such effects as long traces on printed circuit board (PCB)), then the input data integrity may be degraded and a large amount of ISI will reduce the data eye opening both in terms of amplitude and time. Very often, the input data eye will be completely closed due to the low-pass filter (LPF) nature of the communication channel, and this can cause a large amount of errors if such data is directly connected to the decision-making circuit. In this case, a circuit with larger gain at higher frequency and a reduced gain a low frequency is often employed to boost the signal strength at the high frequency. Such a circuit may generally be referred to as an equalizer and is widely employed to restore the signal integrity that has been compromised by a data communication channel having the low bandwidth.

As communication systems continue to achieve higher and higher integration levels and as they become more and more adaptive, a data amplifier/equalizer may be employed to accommodate input signals that are passed through various communication channels. Especially for transmission rates of the order of 10 Gigabits and higher, there are a variety of different standards and system definitions which results in different input data quality.

For example, XENPAK multi-source agreement (MSA) defines a fiber optical module that conforms to the well-known IEEE standard for 10 Gigabit Ethernet (GbE) physical media dependent (PMD) types. In a XENPAK module, since the 10 Gbps (Giga-bits per second) signal is connected locally to the optical components, the 10 Gbps signals do not have to travel long distances. In this case, the frequency response of the data buffer in the receiver in the physical layer should be flat over a wide frequency range to preserve the integrity of the information in the electrical signals being converted from optical to electrical signals. On the other hand, in Fibre channel applications, system manufacturers prefer to use small form factor optical modules such as XFP instead of XENPAK modules because of the cost savings associated with using multiple ports. In the case of XFP modules, a 10 Gbps signal may travel across the system using a copper (FR4) connection to reach the module. As high-speed communication signals such as 10 Gbps are transmitted over a network, high frequency components of a communication signal are attenuated more than the lower frequency components. It may be desirable to insert an equalizer in the data buffer to provide an equalization element that amplifies the incoming signal and amplifies the higher frequency signal components more than the lower frequency signal components. Since Ethernet and Fibre Channel systems exhibit different signal attenuation properties, an optimal equalization element for an Ethernet system will have different characteristics than an optimal equalization element for a Fibre Channel system.

Figure 2:
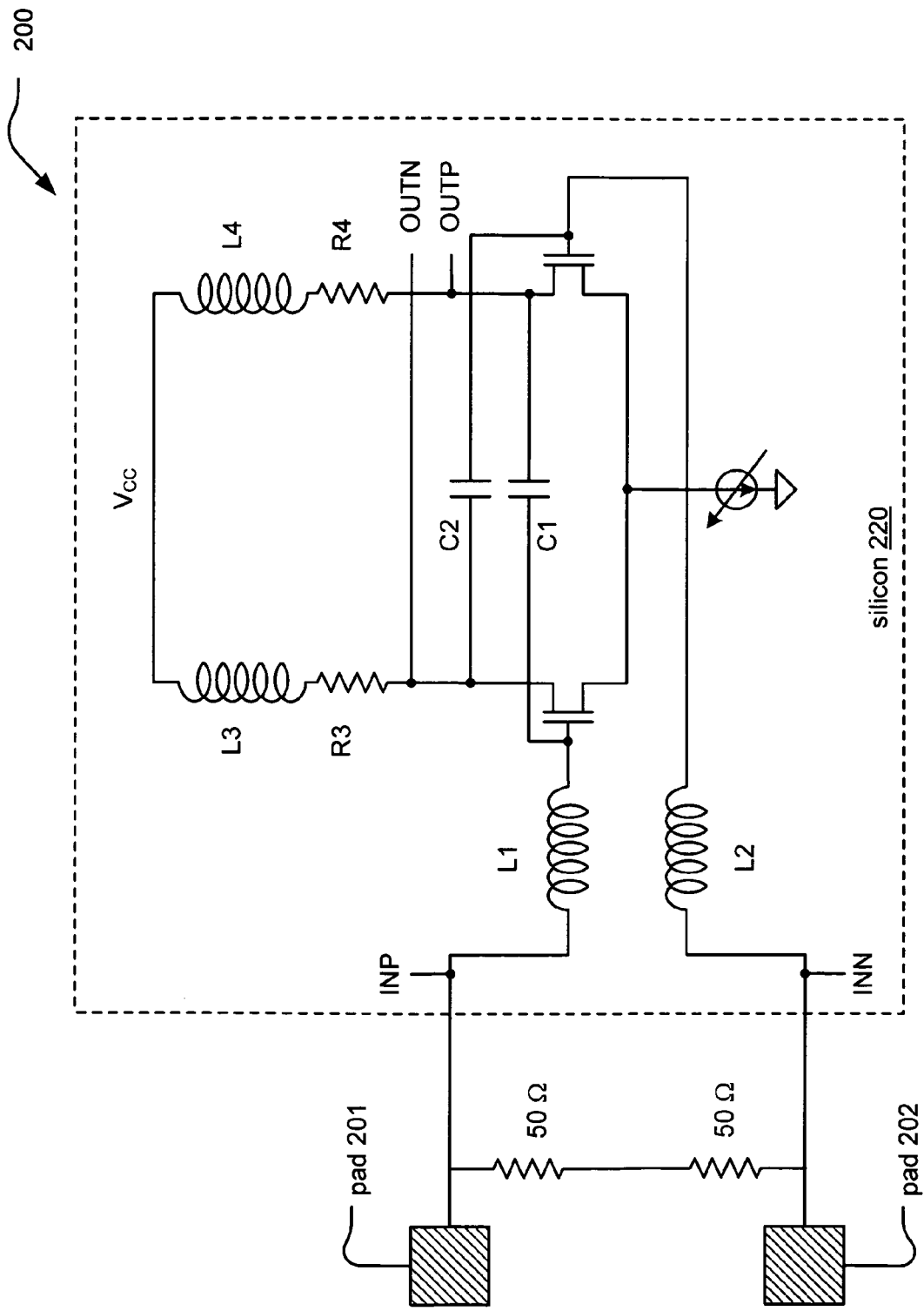
FIG. 2 illustrates an embodiment of a current-controlled CMOS (C3MOS) wideband data amplifier circuit.

FIG. 2 illustrates an embodiment of a current-controlled CMOS (C3MOS) wideband data amplifier circuit 200. While not performing any equalization, this C3MOS wideband data amplifier circuit 200 does still provide for a partial solution to the impedance mismatching which may be introduced by the prior art two path embodiment 100 described above.

The input series inductors (L1 and L2) resonate with the capacitance at the input of the differential pair at high frequencies and thus extend the bandwidth of the amplifier. In addition, at high frequencies, the inductors (L1 and L2) act as high impedance chokes between the termination resistors (shown as two series connected 50 Ω resistors) and the capacitors and thus also improve the input reflection of the chip.

Figure 3:
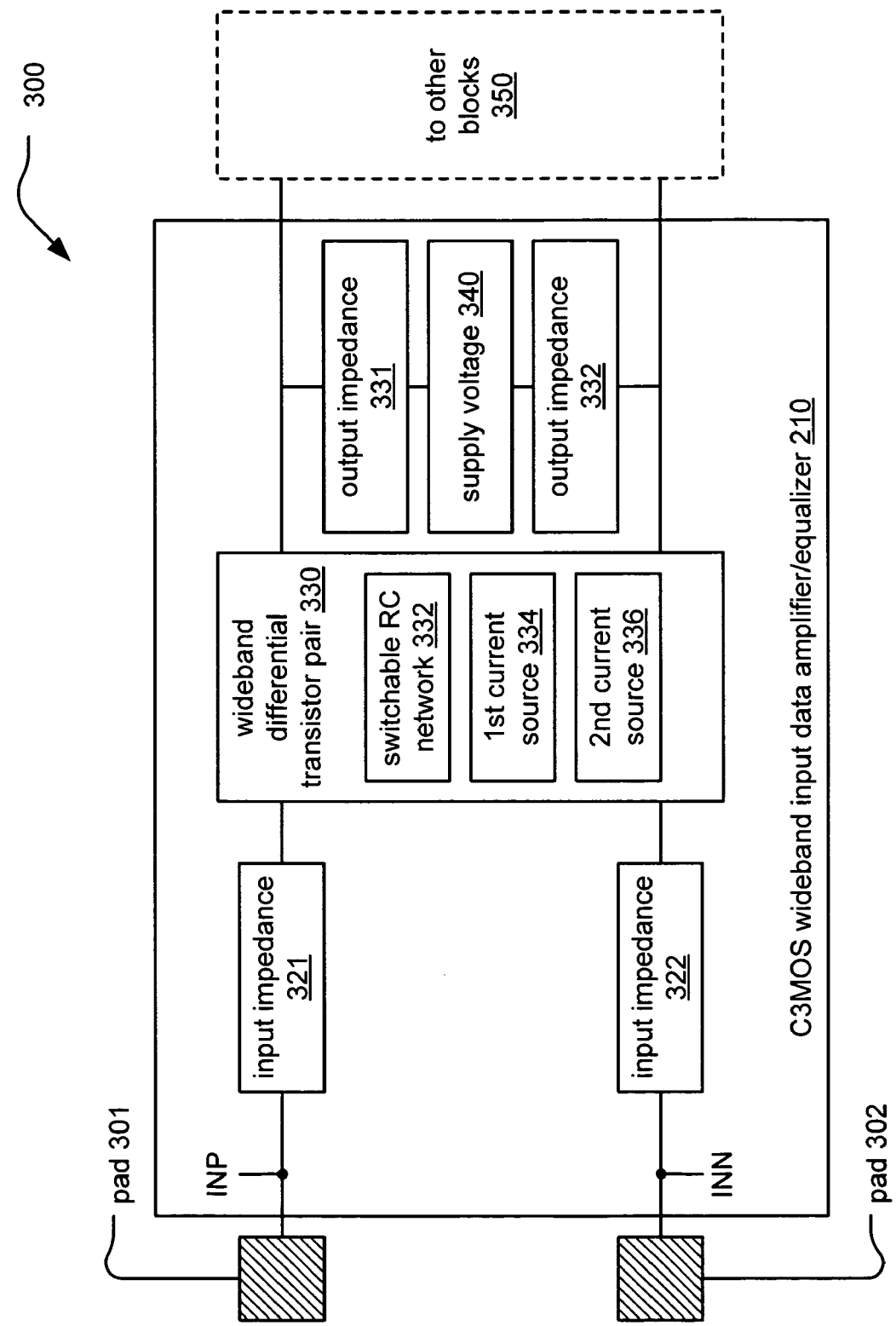
FIG. 3 illustrates an embodiment of a C3MOS wideband data amplifier/equalizer circuit with adjustable gain and frequency response without additional power or loading.

FIG. 3 illustrates an embodiment 300 of a C3MOS wideband data amplifier/equalizer circuit 310 with adjustable gain and frequency response without additional power or loading.

A novel approach is presented by which an adjustable amplifier/equalizer stage may be implemented without suffering from many of the undesirable and deleterious effects described above with respect to a two path embodiment 100 of an adjustable amplifier/equalizer. One of the many advantages of this new design is that all the bandwidth extension techniques existent in the context of C3MOS wideband data amplifiers can be readily applied to a C3MOS wideband data integrated amplifier/equalizer stage.

In FIG. 3, series input impedances 321 and 322, output impedances 331 and 332 are all added so that the stage can achieve high bandwidth with a minimum increase in power consumption. If desired, as is shown below within other embodiment, and negative Miller capacitors may also be employed. The input impedances 321 and 322 may be largely inductive or composed only of series connected inductors in some embodiments. The output impedances 331 and 332 may also have an inductive component and may include a shunt peaking inductor and a resistor connected in series in some embodiments. By using this new design approach, the overall gain can be adjusted by changing the amount of current flowing into the input pair of the transistors.

The C3MOS wideband data amplifier/equalizer circuit 310 may be any stage within a cascaded chain of such amplifier stages. Two differential input pads (shown as 301 and 302) communicatively couple to the C3MOS wideband data amplifier/equalizer circuit 310 providing a differential input signal (shown as INP and INN). Two separate input impedances (shown as 321 and 322) are connected serially between the inputs (i.e., INP and INN) of the C3MOS wideband data amplifier/equalizer circuit 310 and a wideband differential transistor pair 330.

The wideband differential transistor pair 330 includes a switchable RC network 332, a $1^{st}$ current source 334, and a $2^{nd}$ current source 336. This use of these 3 components within the wideband differential transistor pair 330 provide for much of the adjustability of the gain and equalizer characteristics of the C3MOS wideband data amplifier/equalizer circuit 310. For example, the switchable RC network 332 may be shorted out thereby making the C3MOS wideband data amplifier/equalizer circuit 310 operate with very little, if any, equalization characteristics and rather largely as a flat gain stage. Alternatively, the switchable RC network 332 may be implemented to having a wide variety of selectable options for which equalization and amplification may both be performed as desired in a given application. For example, a designer may design the switchable RC network 332 to have a variety of selectable positions for which various types of amplification and equalization is performed. The overall frequency response of the C3MOS wideband data amplifier/equalizer circuit 310 may thereby be appropriately selected to comport with the particular application at hand.

Two separate output impedances (shown as 331 and 332) couple between the wideband differential transistor pair 330 and a supply voltage 340 within the C3MOS wideband data amplifier/equalizer circuit 310. The supply voltage 340 may simply be a node within the C3MOS wideband data amplifier/equalizer circuit 310 that receives a power supply's voltage and brings it into the C3MOS wideband data amplifier/equalizer circuit 310. The differential output signal of the wideband differential transistor pair 330 (which is also the differential output signal of the C3MOS wideband data amplifier/equalizer circuit 310) then communicatively couples to one or more other blocks 350 within the same integrated circuit or via appropriate integrated circuit connections to one or more other integrated circuits, circuit boards, blocks and/or devices.

A designer is provided a great deal of latitude in selecting the individual components of the input impedances 321 and 322. Analogously, a designer is provided a great deal of latitude in selecting the individual components of the output impedances 331 and 332. Some possible embodiments by which these various blocks may be implemented are presented below.

For example, it is noted that the C3MOS wideband data amplifier/equalizer circuit 310 may also be further improved by replacing the input impedances 321 and 322 (e.g., that may typically be primarily inductive in many embodiments) with an inductive network that includes (multiple) inductor(s), resistor(s) and capacitor(s). The design focus idea is to use more elements (i.e., the appropriate number and combination of elements) to match the impedance looking towards board and/or package more precisely within a broader frequency range and at the same time to create a resonant circuit to generate peaking at high frequency so that the bandwidth of the circuit can be extended. In this case, the overall series resistance in the input impedances 321 and 322 of the matching impedance network 320 (e.g., which may be largely inductive in many instances) needs to be small in order to still have a good impedance matching at the low frequencies and to be able to create effective peaking to extend the bandwidth.

Figure 4:
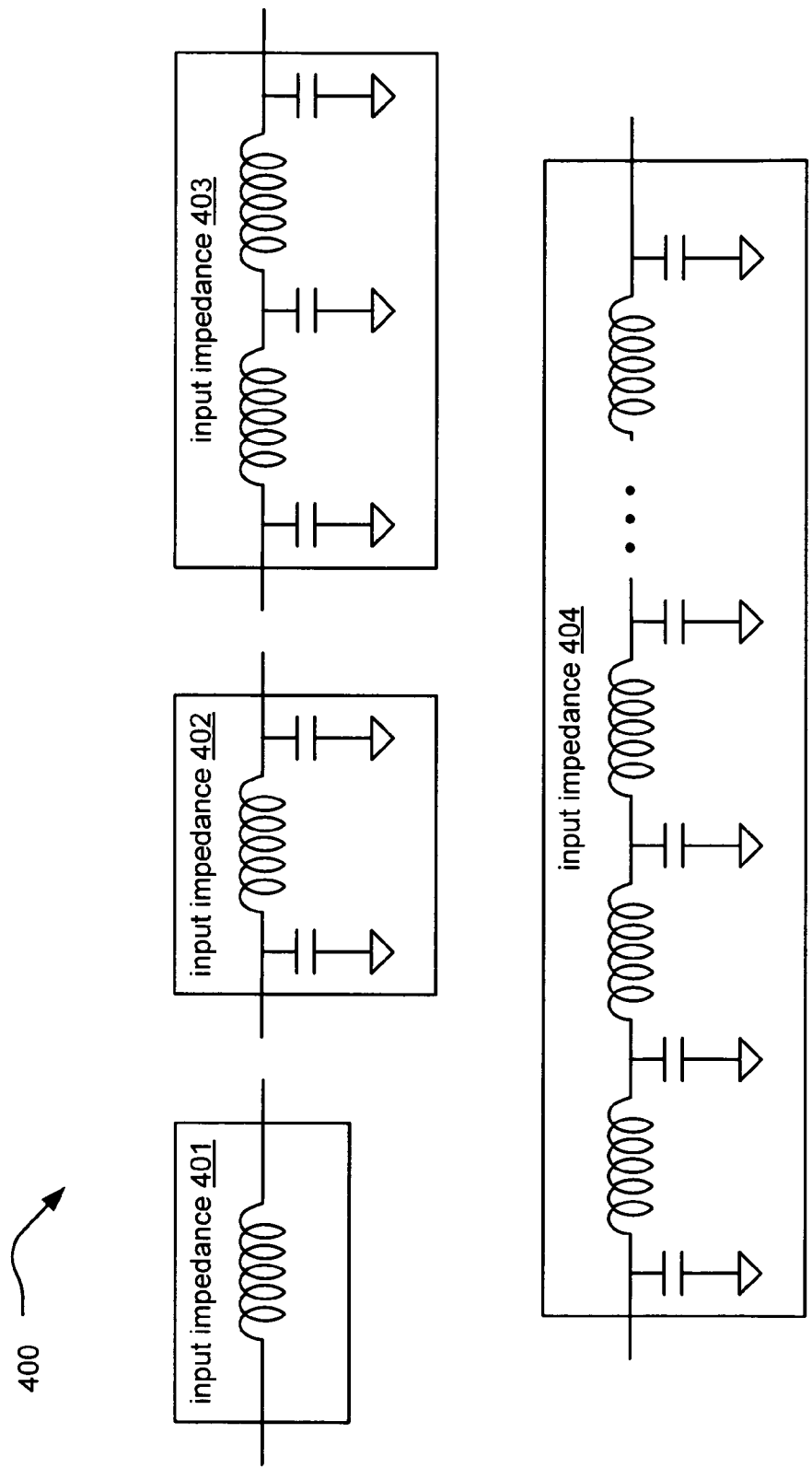
FIG. 4 and FIG. 5 illustrate various embodiments of input impedance that may be employed within a C3MOS wideband data amplifier/equalizer circuit that has been constructed.

FIG. 4 illustrates various embodiments 400 of input impedance that may be employed within a C3MOS wideband data amplifier/equalizer circuit that has been constructed. As mentioned above, the input impedances 321 and 322 of the FIG. 3 may be designed in a variety of ways. Input impedance 401 includes simply a series connected inductor. Input impedance 402 includes a series connected inductor with two separate shunt capacitors location at the two ends of the series connected inductor. Input impedance 403 includes two series connected inductors with three separate shunt capacitors location at the nodes generated by the two series connected inductors. Generally speaking, any number of selected series connected inductors and shunt capacitors may be selected as shown by the input impedance 404 that includes a plurality of series connected inductor with a plurality of shunt capacitors location at the various nodes generated by the plurality of series connected inductors. In most instances, to match the impedance looking towards the package and/or circuit board side and looking towards the silicon side, it is advantageous to make the input more inductive.

It is noted that within any actual physical component (e.g., an inductor, L), there is some inherent resistance. In some instances, a designer takes advantage of this inherent resistance in his design in an effort to modify somewhat the impedance matching capabilities of his network. However, there may be some instances where a designer wishes to have some additional resistance as well. Each of the series connected inductor of the various embodiments depicted within the FIG. 4 can also be replaced with a series connected inductor and a series connected resistor, whose values are selected by the designer. It is also noted that, in those embodiments including more than one series connected inductor, some of the series connected inductors can be replaced by a series connected inductor and a series connected resistor, while some of the series connected inductors can be left unmodified. The following diagram illustrates a series connected inductor can be replaced by a series connected inductor and a series connected resistor.

Figure 5:
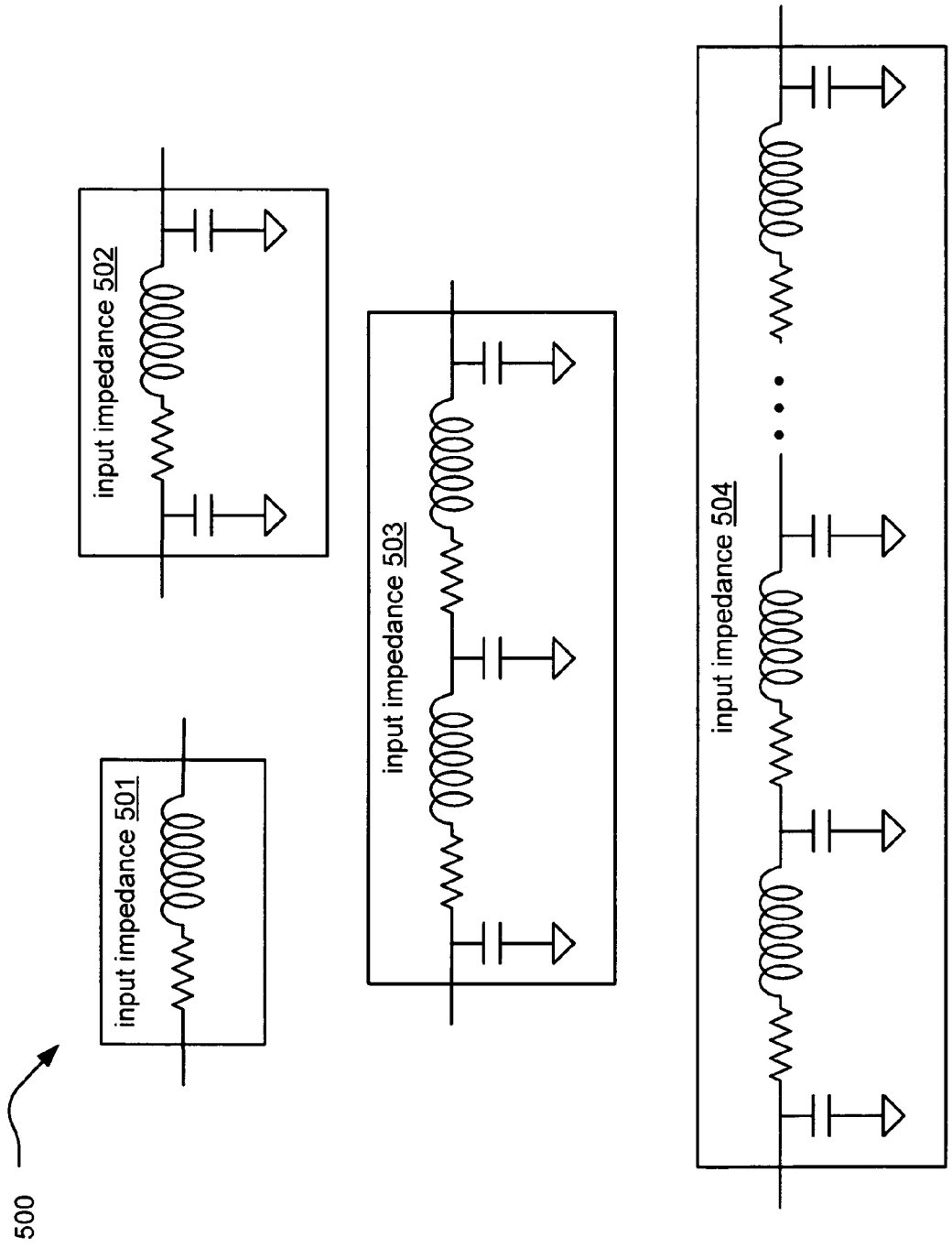

FIG. 5 illustrates various embodiments 500 of input impedance that may be employed within a C3MOS wideband data amplifier/equalizer circuit that has been constructed. As also mentioned above, the input impedances 321 and 322 of the FIG. 3 may be designed in a variety of ways. Input impedance 501 includes simply a series connected inductor and a series connected resistor. Input impedance 502 includes a series connected inductor and resistor combination with two separate shunt capacitors location at the two ends of the series connected inductor and resistor combination. Input impedance 503 includes two series connected inductor and resistor combinations with three separate shunt capacitors location at the nodes generated by the two series connected inductor and resistor combinations. Generally speaking, any number of selected series connected inductor and resistor combinations and shunt capacitors may be selected as shown by the input impedance 504 that includes a plurality of series connected inductor and resistor combinations with a plurality of shunt capacitors location at the various nodes generated by the plurality of series connected inductor and resistor combinations. In most instances, to match the impedance looking towards the package and/or circuit board side and looking towards the silicon side, it is advantageous to make the input more inductive. However, as stated above, a designer can modify the design by including one or more resistors connected in series with one of more of the series connected inductors as well without departing from the scope and spirit of the invention. Clearly, a designer can also reverse the order any series connected inductor and resistor combination (i.e., the resistor or the inductor can be first).

Figure 6:
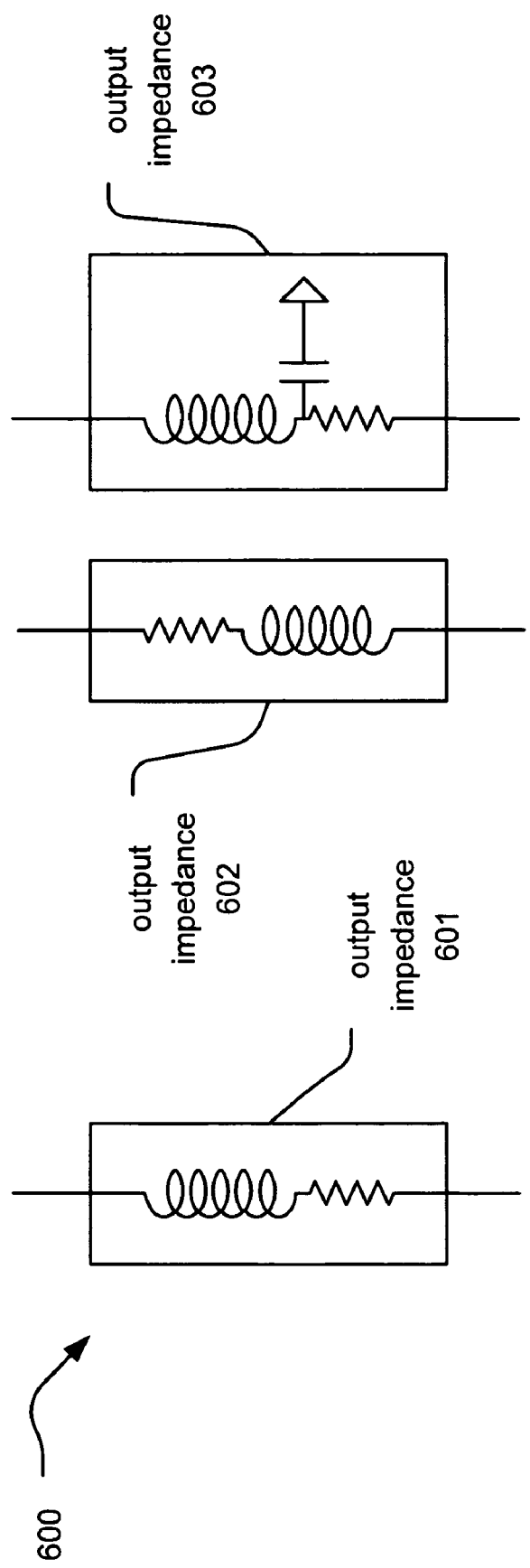
FIG. 6 illustrates various embodiments of output impedance that may be employed within a C3MOS wideband data amplifier/equalizer circuit that has been constructed.

FIG. 6 illustrates various embodiments 600 of output impedance that may be employed within a C3MOS wideband data amplifier/equalizer circuit that has been constructed. As mentioned above, the output impedances 331 and 332 of the FIG. 3 may be designed in a variety of ways. Output impedance 601 includes a series connected resistor and inductor in one order, and output impedance 602 also includes a series connected resistor and inductor but in a reverse order. Output impedance 603 includes a series connected resistor and inductor the same order as the output impedance 601 while also include a shunt capacitor connected to the node generated at the connection of the series connected resistor and inductor.

For each of these embodiments depicted within the FIG. 5 and FIG. 6, it is noted that these possible embodiments are not exhaustive but merely illustrative of the wide variety and latitude that a designer is provided to select the various components to be employed within a C3MOS wideband data amplifier/equalizer circuit having adjustable amplification and equalization characteristics.

Figure 7:
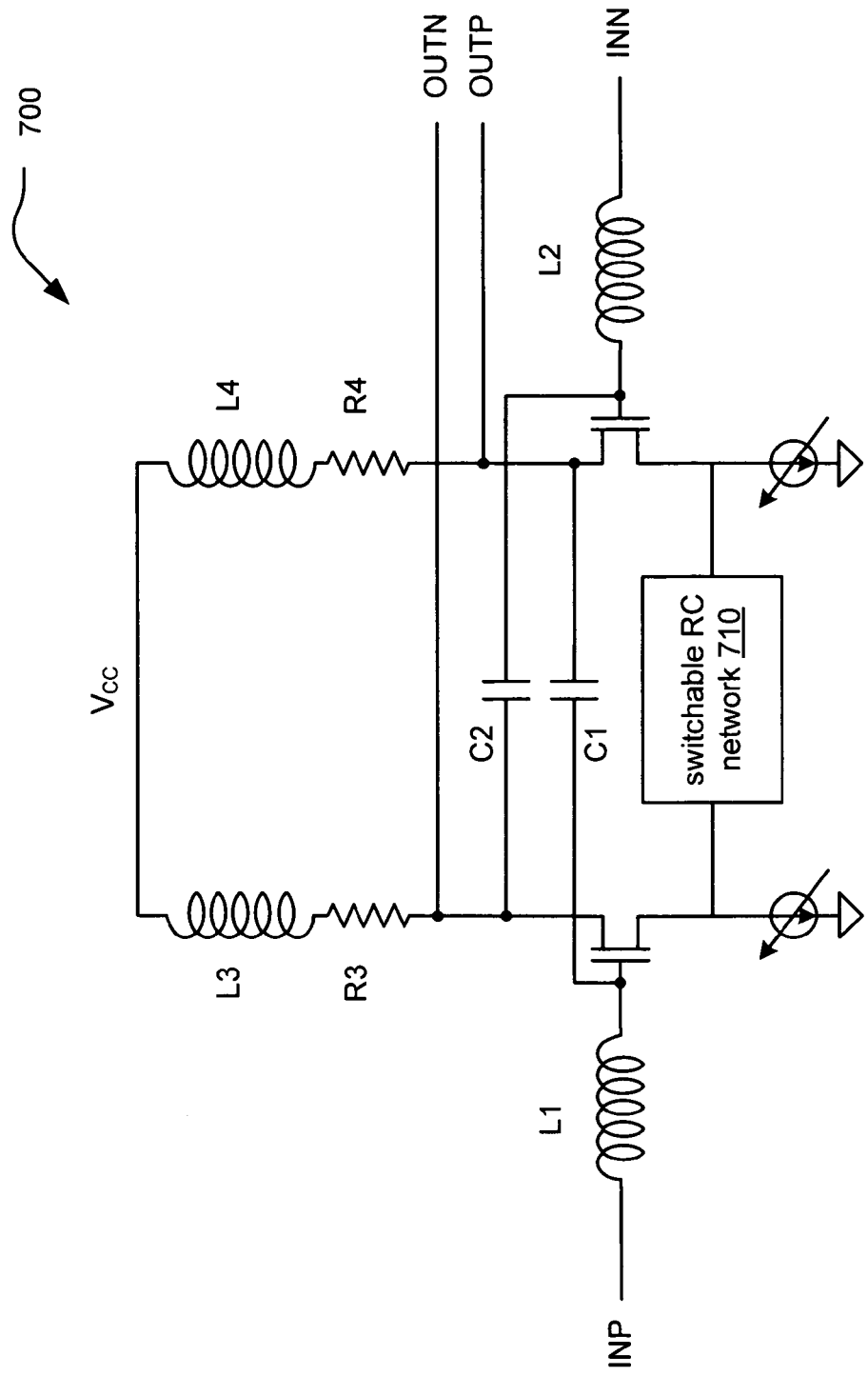
FIG. 7 illustrates another embodiment of a C3MOS wideband data amplifier/equalizer circuit with adjustable gain and frequency response without additional power or loading.

FIG. 7 illustrates another embodiment of a C3MOS wideband data amplifier/equalizer circuit 700 with adjustable gain and frequency response without additional power or loading.

Two separate current source transistors may be biased by bias voltages so that a constant current flows from drain to source in each of the current source transistors. Two separate differential transistors compose a wideband differential transistor pair. A first differential transistor has its gate tied to the negative end of a first series peaking inductor L1, while a positive differential input signal INP is coupled to the positive end of the first series peaking inductor L1. Similarly, a second differential transistor has its gate tied to the negative end of a second series peaking inductor L2, while a negative differential input signal INN is coupled to the positive end of the second series peaking inductor L2.

Assuming that the first and second differential transistors are identical, then the first and second series peaking inductors L1 and L2 have the same inductance. A first output resistor R3 has its negative end tied to the drain of the first differential transistor, and has its positive end tied to the negative end of a first shunt peaking inductor L3. A second output resistor R4 has its negative end tied to the drain of the second differential transistor, and has its positive end tied to the negative end of a second shunt peaking inductor L4. The positive ends of the first and second shunt peaking inductors L3 and L4 are tied to the positive supply voltage (shown as $V_{CC}$). Preferably, the first and second output resistors R3 and R4 have the same resistance value R, and the first and second shunt peaking inductors L3 and L4 have the same inductances. A first capacitor C1 (which may be referred to as a first Miller cancellation capacitor C1) has its positive end coupled to the drain of the second differential transistor, and has its negative end coupled to the gate of the first differential transistor. A second capacitor C2 (which may be referred to as a second Miller cancellation capacitor C2) has its positive end coupled to the drain of the first differential transistor, and has its negative end coupled to the gate of the second differential transistor. A first output signal OUTP is taken at the drain of the second differential transistor, and the second output signal OUTN is taken at the drain of the first differential transistor.

When comparing the C3MOS wideband data amplifier/equalizer circuit 700 of the FIG. 7 with the C3MOS wideband data amplifier circuit 200 of the FIG. 2, it can clearly be seen that the C3MOS wideband data amplifier/equalizer circuit 700 includes a switchable RC network 710 is implemented in between the two separate current source transistors. In place of these components, the C3MOS wideband data amplifier circuit 200 simply includes a singular current source transistor.

FIG. 8A, FIG. 8B, FIG. 8C, FIG. 8D, FIG. 9A, FIG. 9B, FIG. 10A, FIG. 10B, FIG. 11A, and FIG. 11B illustrate various embodiments of switchable RC networks that may be employed within a C3MOS wideband data amplifier/equalizer circuit that has been constructed.

Figure 8D:
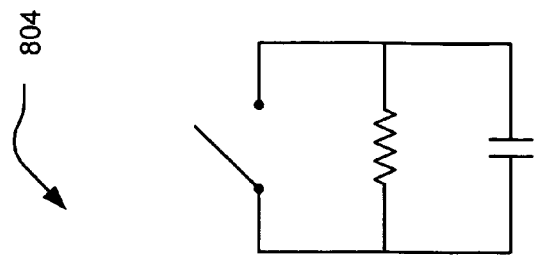
FIG. 8A, FIG. 8B, FIG. 8C, FIG. 8D, FIG. 9A, FIG. 9B, FIG. 10A, FIG. 10B, FIG. 11A, and FIG. 11B illustrate various embodiments of switchable RC networks that may be employed within a C3MOS wideband data amplifier/equalizer circuit that has been constructed.
Figure 8C:
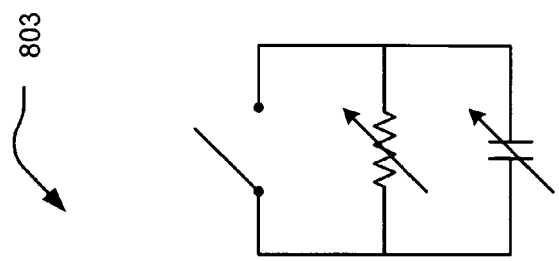
Figure 8B:
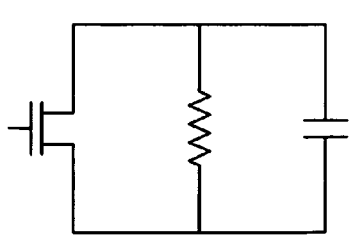
Figure 8A:
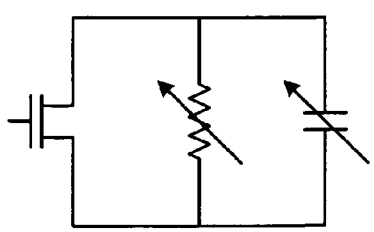

Referring to FIG. 8A, this diagram shows an example of the RC network which enables a C3MOS wideband data amplifier/equalizer circuit, constructed, to have either a flat frequency response or a high-pass response with different amount of high frequency boost. As seen from FIG. 8A, when the control signal is high, the NMOS will switch on and thus short node A and B. These two nodes A and B may be viewed as being the sources of the first and second differential transistors of the wideband differential transistor pair of the FIG. 7.; alternatively and more generally, these two nodes A and B may be viewed as being the points at which the switchable RC network 332 couples to the wideband differential transistor pair 330 within the FIG. 3. In this configuration, the integrated C3MOS wideband data amplifier/equalizer circuit stage behaves like a conventional wideband amplifier and has a flat frequency response. When the control signal is low, the NMOS is switched off and the sources of the two input transistors are connected by a parallel RC network. The circuit of FIG. 3 will behave like an equalizer (e.g., adjusting the frequency response of the C3MOS wideband data amplifier/equalizer circuit stage), which has a low gain at low frequencies and higher gain at higher frequencies. The amount of high frequency boost can be adjusted by the value of the resistor and the peaking frequency can be adjusted by the variable capacitor.

By eliminating the double paths existent in the prior art two path embodiment of an adjustable amplifier/equalizer described above, the C3MOS wideband data amplifier/equalizer circuit stage does not require the summing stage and thus reduces the power significantly. There is also no extra capacitive loading added to the high speed path either at the input or the output. As a result, it is much easier to incorporate the integrated C3MOS wideband data amplifier/equalizer circuit stage into the data path of a communication device or corn system without compromising the signal integrity or degrading the impedance matching.

It is also noted that the variable resistor of FIG. 8A can be implemented by PMOS or NMOS transistors using gate voltage to control the conductivity. The variable capacitance can be implemented by metal-oxide-semiconductor (MOS) varactors. In such an implementation, the boost level of the high pass equalizer and the corner frequency can be adjusted continuously.

Referring to FIG. 8B, this diagram is very analogous to the FIG. 8A with the exception that the resistor and the capacitor are not variable. In such an embodiment, a designer may have a very good idea of the frequency response and amplification required for a particular application. In such a case, a designer may simply select the particular values to be employed for a given switchable RC network and implement them directly without worrying about variability.

Referring to FIG. 8C and to FIG. 8D, these diagrams are analogous to the FIGS. 8A and 8B with the exception that the switches are implemented using some other type of switching technology. For example, the switches in the FIG. 8C and FIG. 8D may simply be hard switches, optically controlled switches, or any other types of switching technology without departing from the scope and spirit of embodiments of the invention.

Figure 9B:
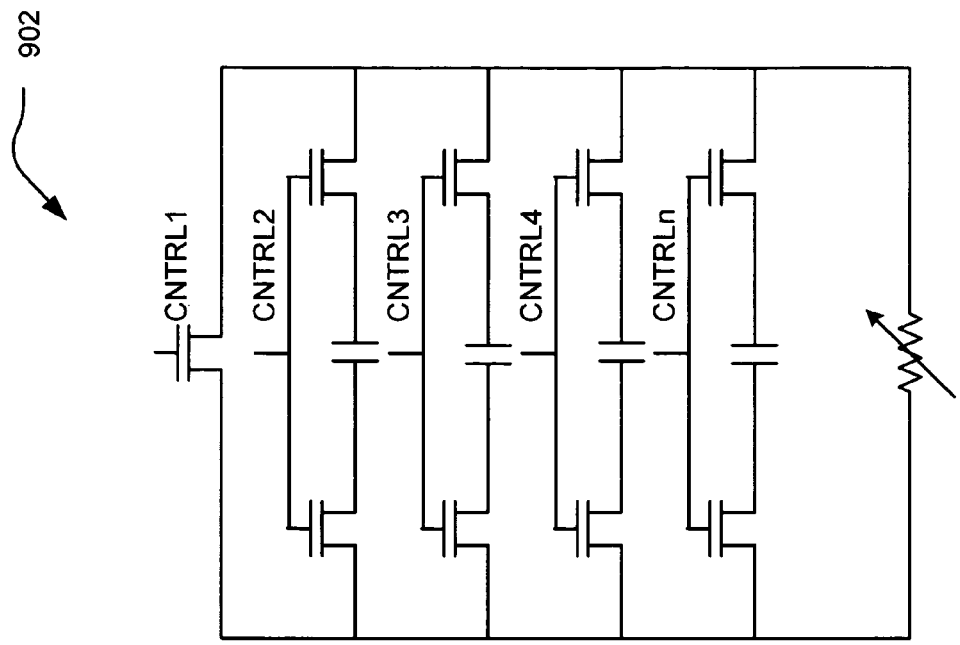
Figure 9A:
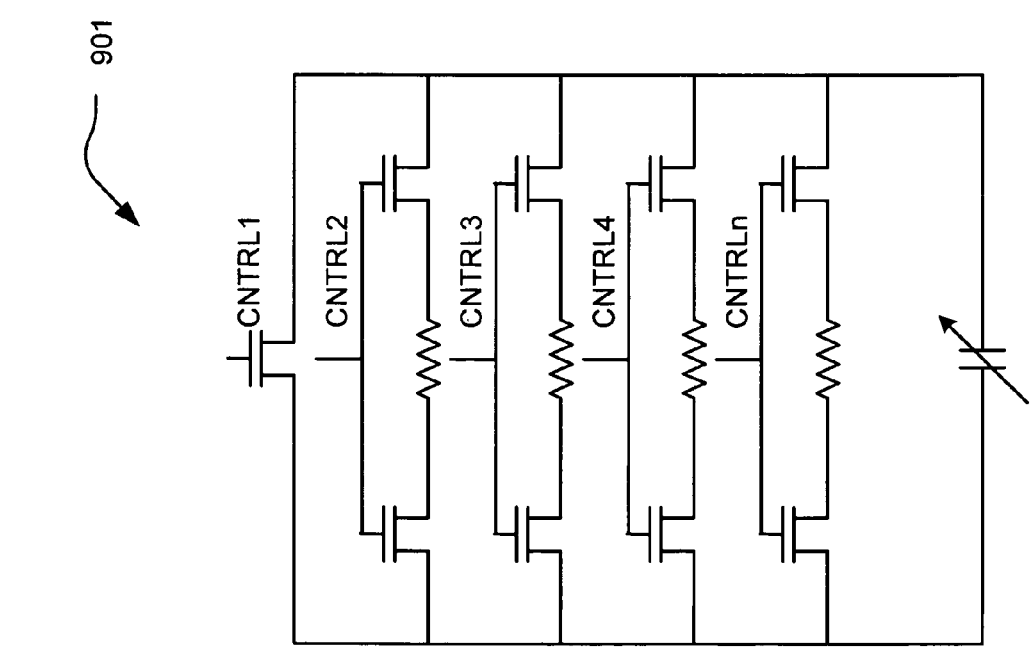

Referring to FIG. 9A, this diagram depicts an array 901 of corporately (and individually) switchable resistors to provide for great ability of selection for a wide variety of application with different equalization needs. A variable capacitor is also employed to allow for flexibility and tuning of the filtering and equalization characteristics of the switchable RC network depicted. A programmable integrated C3MOS wideband data amplifier/equalizer circuit stage can be realized by creating a parallel RC network connected to MOS switches, which in turn is connected to digital control signals to select different RC values so that the frequency response of the circuit can be readily programmed.

Referring to FIG. 9B, this diagram is analogous to the FIG. 9A with the exception that FIG. 9B includes an array 902 of corporately (and individually) switchable capacitors to provide for great ability of selection for a wide variety of application with different equalization needs. A variable resistor is also employed to allow for flexibility and tuning of the filtering and equalization characteristics of the switchable RC network depicted.

It is also noted that for each of the embodiments 901 of the FIG. 9A and 902 of the FIG. 9B, the resistors and MOSFETs can be switched. Specifically, in the FIG. 9A, the branches controlled by the signals CNTRL2, CNTRL3, CNTRL4, . . . CNTRLn can be modified such that each of the resistors therein can be replaced by a MOSFET, and the MOSFETs therein can be replaced by resistors. This configuration is depicted in embodiment 1001 of FIG. 10A.

Analogously, in the FIG. 9B, the branches controlled by the signals CNTRL2, CNTRL3, CNTRL4, . . . CNTRLn can be modified such that each of the capacitors therein can be replaced by a MOSFET, and the MOSFETs therein can be replaced by capacitors. This configuration is depicted in embodiment 1002 of FIG. 10B.

Figure 11B:
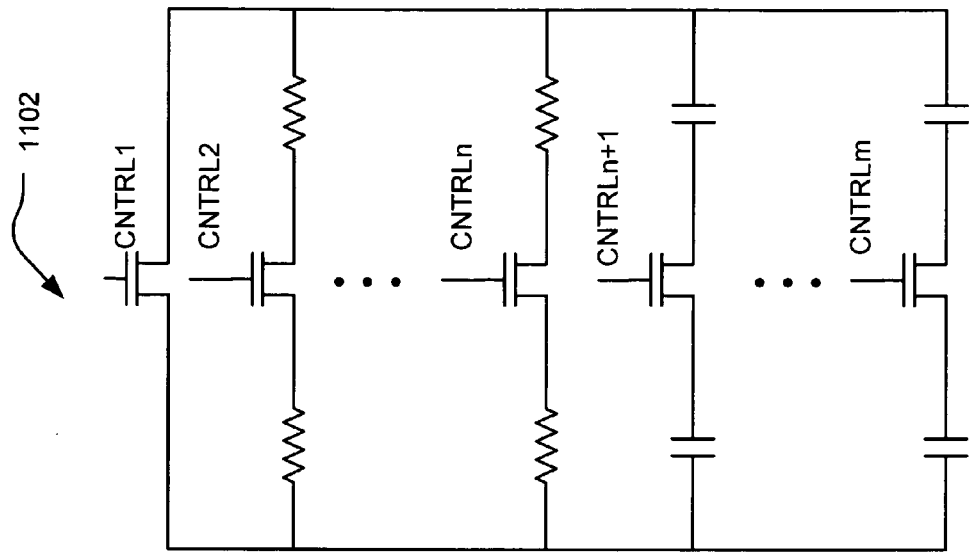
Figure 11A:
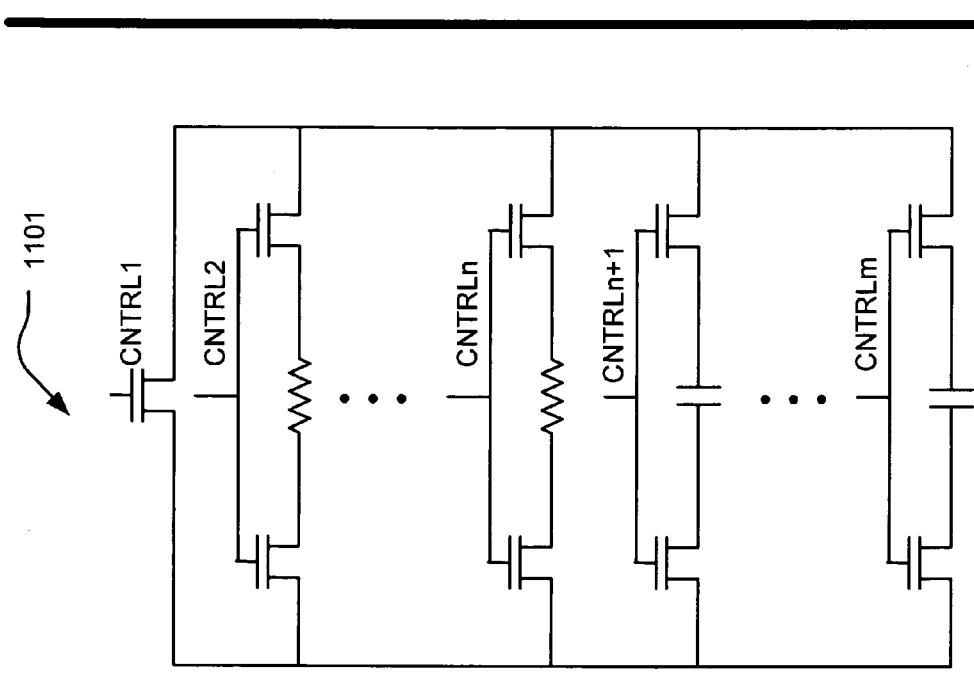

Referring to FIG. 11A, this diagram is largely a combination 1101 of the FIG. 9A and the FIG. 9B (without including the variable capacitor or the variable resistor). The FIG. 11A includes an array of corporately (and individually) switchable resistors and an array of array of corporately (and individually) switchable capacitors to provide for great ability of selection for a wide variety of application with different equalization needs.

Figure 10B:
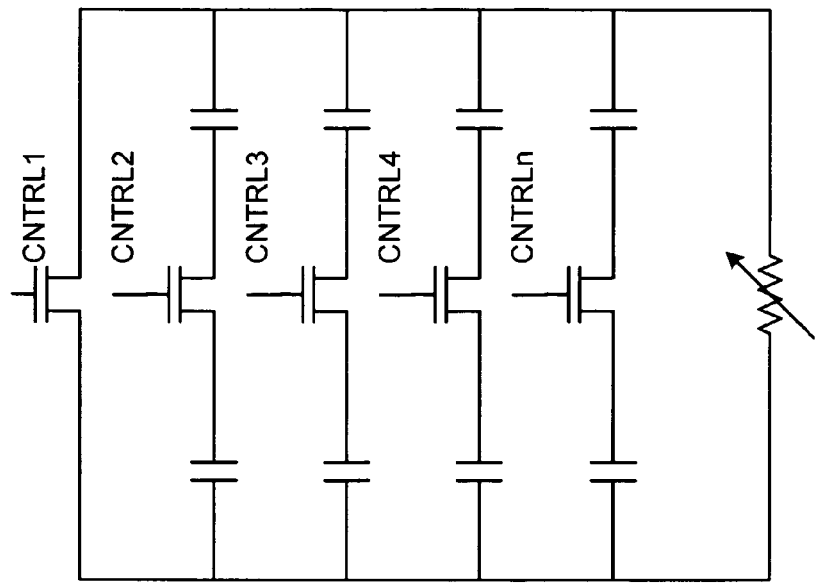
Figure 10A:
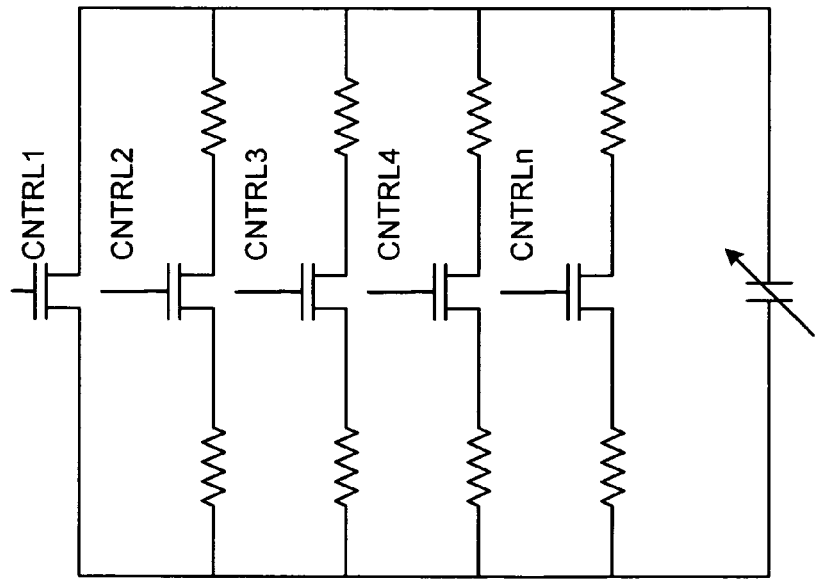

Referring to FIG. 11B, this diagram is largely a combination 1102 of the FIG. 10A and the FIG. 10B (without including the variable capacitor or the variable resistor). The FIG. 11B includes an array of corporately (and individually) switchable resistors and an array of array of corporately (and individually) switchable capacitors to provide for great ability of selection for a wide variety of application with different equalization needs.

With these various embodiments provided herein, a very broad range of equalization and amplification options may be realized to accommodate a wide variety of applications. It is also noted that a designer is given a great deal of latitude in selecting a particular configuration. A designer can mix and match various components selected from each of these various embodiments depicted herein.

Figure 12:
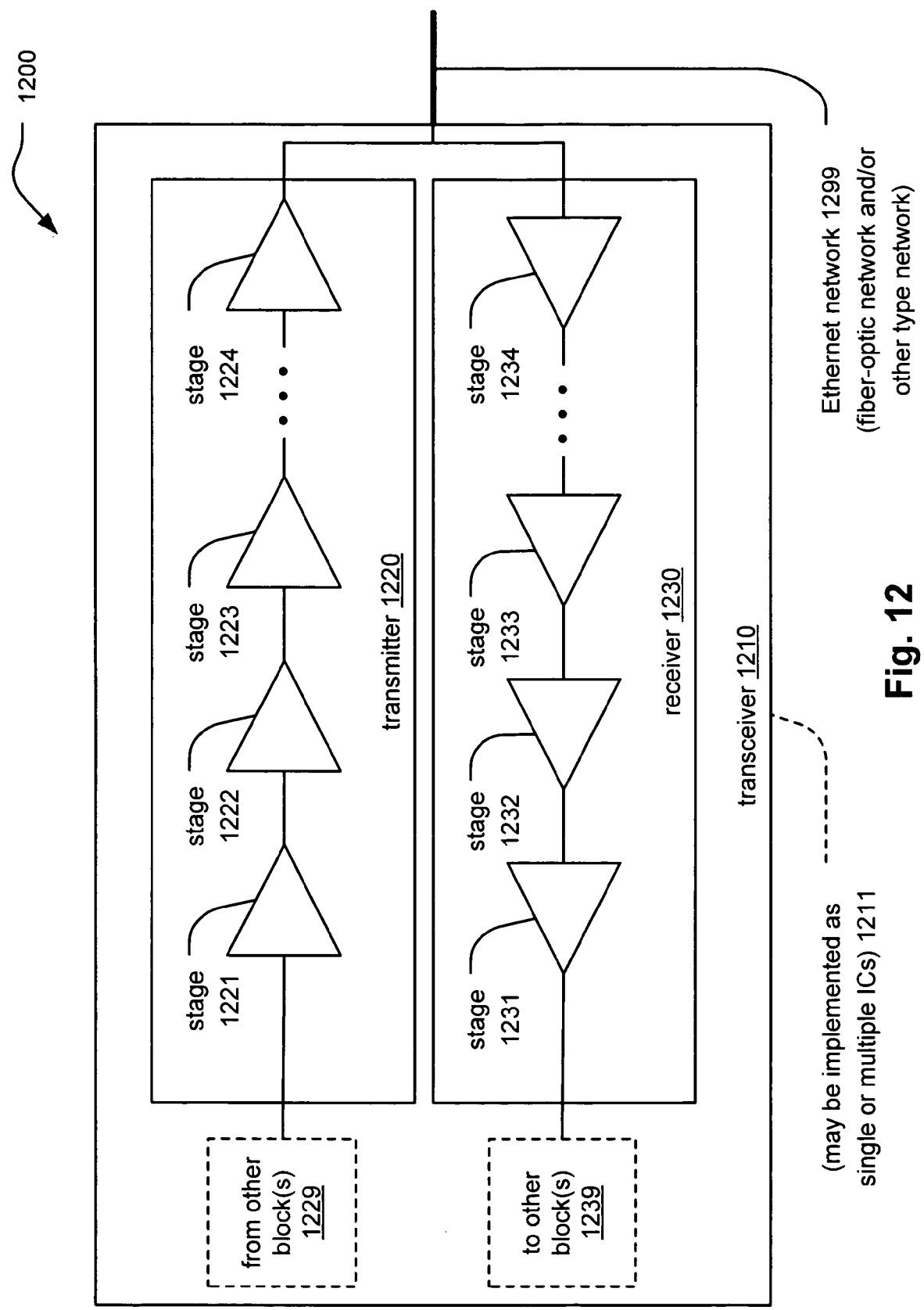
FIG. 12 illustrates an embodiment of implementation of one or more C3MOS wideband data amplifier/equalizer circuits within a communication transceiver that communicatively couples to a communication network.

FIG. 12 illustrates an embodiment 1200 of implementation of one or more C3MOS wideband data amplifier/equalizer circuits within a communication transceiver that communicatively couples to a communication network.

This diagram shows a communication transceiver 1210 that may be implemented in any of a wide variety of communication systems. For example, the communication transceiver 1210 may communicatively couple to and communicate with an Ethernet network 1299. Such an Ethernet network 1299 may be implemented as a fiber-optic network; generally speaking, the Ethernet network 1299 may also be implemented as a wired network or a combination network that includes both wired and wireless components. As desired, the communication transceiver 1210 may be implemented to perform bi-directional communication with a wide variety of communication system types. In addition, the communication transceiver 1210 may be implemented as a single integrated circuit in some embodiments. Alternatively, various components of the communication transceiver 1210 and the functional blocks included therein may also be implemented using individual integrated circuits, and these integrated circuits may be integrated together to form a larger module or device that composes the communication transceiver 1210.

Looking at the bi-directional capability of the communication transceiver 1210, it can be seen that there is an upstream and a downstream flow. Looking from another perspective, there in an input flow to the communication transceiver 1210, and there is an output flow from the communication transceiver 1210. The output flow within the communication transceiver 1210 may come from 1 or more other blocks (shown as reference numeral 1229) within or outside of the communication transceiver 1210; this flow passes to a transmitter 1220. This transmitter 1220 may be simply a functional block within the communication transceiver 1210 (i.e., when the communication transceiver 1210 is implemented as a singular integrated circuit). Alternatively, this transmitter 1220 may itself be a distinct integrated circuit that is part of a number of integrated circuits that compose the communication transceiver 1210. Analogously, the input flow to the communication transceiver 1210 comes from the very network to which the communication transceiver 1210 communicatively couples and with which the communication transceiver communicates. This input flow to the communication transceiver 1210 passes to 1 or more other blocks (shown as reference numeral 1239) within or outside of the communication transceiver 1210 after having passed through the initial processing component of a receiver 1230. As with the transmitter 1220, this receiver 1230 may be simply a functional block within the communication transceiver 1210 (i.e., when the communication transceiver 1210 is implemented as a singular integrated circuit). Alternatively, this receiver 1230 may itself be a distinct integrated circuit that is part of a number of integrated circuits that compose the communication transceiver 1210.

It is common to employ various amplifier and/or buffer stages within each of the paths (input and output) within the communication transceiver 1210. For example, each of the transmitter 1220 and the receiver 1230 is shown as including a plurality of such stages. Specifically, the transmitter 1220 is shown as having stage 1221, stage 1222, stage 1223, . . . , and stage 1224; the receiver 1230 is shown as having stage 1231, stage 1232, stage 1233, . . . , and stage 1234. Any one of these stages may be implemented according to a C3MOS wideband data amplifier/equalizer circuit that has been built in accordance with an embodiment of the invention.

The fact that any of the C3MOS wideband data amplifier/equalizer circuits describe herein is a single path device, there is not a design concern in terms of the upstream and/or downstream loading that is required by the prior art two path embodiment of an adjustable amplifier/equalizer described above. Therefore, such a C3MOS wideband data amplifier/equalizer circuit as described herein can replace any stage in the upstream and/or downstream paths within the communication transceiver 1210.

As described above, a designer is provided a great deal of latitude in designing any of the various components (e.g., input impedances, output impedances, switchable RC networks, biases for the two separate transistor current sources) of such a C3MOS wideband data amplifier/equalizer circuit as described herein. This design flexibility provided to the designer allows for the use of various inductors, capacitors, and/or resistors to ensure the appropriate amplification and/or equalization characteristics as desired within that particular stage.

In summary, a fully differential current controlled CMOS integrated wideband amplifier/equalizer is proposed. At the amplification mode, bandwidth extension techniques such as shunt peaking, series inductive peaking can be readily applied to increase the range of the flat frequency response. In equalization mode, the circuit shows a high-pass response and the level of the boost and corner frequency can be readily adjusted either digitally or continuously. The integrated CMOS integrated wideband amplifier/equalizer can then accommodate input going through various data path and improve the data integrity with out adding extra power or loading.

In view of the above detailed description of the invention and associated drawings, other modifications and variations will now become apparent. It should also be apparent that such other modifications and variations may be effected without departing from the spirit and scope of embodiments of the invention.

What is claimed is:

1. A current-controlled CMOS (C3MOS) wideband data amplifier/equalizer circuit having adjustable gain and frequency response, the circuit comprising:

a first differential transistor comprising a source, gate, and drain;

a second differential transistor comprising a source, gate, and drain;

a first current source that is coupled to the source of the first differential transistor;

a second current source that is coupled to the source of the second differential transistor;

a first output impedance, comprising a first output resistor and a first shunt peaking inductor connected in series, that is coupled between the drain of the first differential transistor and a supply voltage;

a second output impedance, comprising a second output resistor and a second shunt peaking inductor connected in series, that is coupled between the drain of the second differential transistor and the supply voltage;

a first input impedance that is coupled between a first differential input of the C3MOS wideband data amplifier circuit and the gate of the first differential transistor; and a second input impedance that is coupled between a second differential input of the C3MOS wideband data amplifier circuit and the gate of the second differential transistor;

a first capacitor that is coupled between the drain of the first differential transistor and the gate of the second differential transistor;

a second capacitor that is coupled between the drain of the second differential transistor and the gate of the first differential transistor; and a switchable RC network, comprising a resistor and a capacitor connected in parallel, that is coupled between the source of the first differential transistor and the source of the second differential transistor.

2. The circuit of claim 1, wherein:
the first input impedance comprises a first series inductor; and
the second input impedance comprises a second series inductor.

3. The circuit of claim 1, wherein:
the switchable RC network comprises a plurality of resistors, that includes the resistor, connected in parallel; and
the switchable RC network comprises a plurality of switches that corresponds to the plurality of resistors such that the plurality of switches allows selection of an integer number of resistors that corresponds to the resistor of the plurality of resistors and all resistors of the plurality of resistors.

4. The circuit of claim 1, wherein:
the resistor of the switchable RC network is a variable resistor; and
the capacitor of the switchable RC network is a variable capacitor.

5. The circuit of claim 1, wherein:
the resistor of the switchable RC network is a variable resistor that is implemented as either a PMOS (Positive-Channel Metal-Oxide Semiconductor) or an NMOS (Negative-Channel Metal-Oxide Semiconductor) transistor comprising a source, gate, and drain; and
a gate voltage of the PMOS or the NMOS transistor controls a conductivity of the PMOS or the NMOS transistor thereby determining a resistance of the PMOS or the NMOS transistor.

6. The circuit of claim 1, wherein:
a value of the resistor of the switchable RC network is operable to control a boost between a low frequency gain and a high frequency gain of the C3MOS wideband data amplifier/equalizer circuit; and
a value of the capacitor of the switchable RC network is operable to control a peaking frequency of the C3MOS wideband data amplifier/equalizer circuit.

7. The circuit of claim 1, wherein:
the switchable RC network is operable to select an impedance from a plurality of impedances that includes zero impedance between the source of the first differential transistor and the source of the second differential transistor.

8. The circuit of claim 1, wherein:
the switchable RC network is operable to short the source of the first differential transistor to the source of the second differential transistor.

9. The circuit of claim 1, wherein:
the first output resistor of the first output impedance is coupled between the drain of the first differential transistor and the first shunt peaking inductor of the first output impedance; and
the first shunt peaking inductor of the first output impedance is coupled between the first output resistor of the first output impedance and the supply voltage.

10. The circuit of claim 1, wherein:
the first current source is a first current source transistor;
the second current source is a second current source transistor; and
the first differential transistor, the second differential transistor, the first current source transistor, and the second current source transistor comprise NMOS (Negative-Channel Metal-Oxide Semiconductor) transistors.

11. The circuit of claim 1, wherein:
the first current source is a first current source transistor;
the second current source is a second current source transistor; and
the first differential transistor, the second differential transistor, the first current source transistor, and the second current source transistor comprise PMOS (Positive-Channel Metal-Oxide Semiconductor) transistors.

12. The circuit of claim 1, wherein:
the C3MOS wideband data amplifier/equalizer circuit is one stage of a cascaded plurality of stages in an upstream path or a downstream path in an integrated circuit; and
the integrated circuit is implemented within a receiver functional block of a communication transceiver.

13. A current-controlled CMOS (C3MOS) wideband data amplifier/equalizer circuit having adjustable gain and frequency response, the circuit comprising:
a first differential transistor comprising a source, gate, and drain;
a second differential transistor comprising a source, gate, and drain;
a first current source that is coupled to the source of the first differential transistor;
a second current source that is coupled to the source of the second differential transistor;
a first output impedance, comprising a first output resistor and a first shunt peaking inductor connected in series, that is coupled between the drain of the first differential transistor and a supply voltage;
a second output impedance, comprising a second output resistor and a second shunt peaking inductor connected in series, that is coupled between the drain of the second differential transistor and the supply voltage; and
a switchable RC network, comprising a resistor and a capacitor connected in parallel, that is coupled between the source of the first differential transistor and the source of the second differential transistor; and wherein:
the switchable RC network is operable to select an impedance from a plurality of impedances between the source of the first differential transistor and the source of the second differential transistor.

14. The circuit of claim 13, further comprising:
a first series inductor that is coupled between a first differential input of the C3MOS wideband data amplifier circuit and the gate of the first differential transistor; and
a second series inductor that is coupled between a second differential input of the C3MOS wideband data amplifier circuit and the gate of the second differential transistor;
a first capacitor that is coupled between the drain of the first differential transistor and the gate of the second differential transistor; and a second capacitor that is coupled between the drain of the second differential transistor and the gate of the first differential transistor.

15. The circuit of claim 13, wherein:
the resistor of the switchable RC network is a variable resistor; and
the capacitor of the switchable RC network is a variable capacitor.

16. The circuit of claim 13, wherein:
a value of the resistor of the switchable RC network is operable to control a boost between a low frequency gain and a high frequency gain of the C3MOS wideband data amplifier/equalizer circuit; and
a value of the capacitor of the switchable RC network is operable to control a peaking frequency of the C3MOS wideband data amplifier/equalizer circuit.

17. The circuit of claim 13, wherein:
the switchable RC network is operable to short the source of the first differential transistor to the source of the second differential transistor.

18. A current-controlled CMOS (C3MOS) wideband data amplifier/equalizer circuit having adjustable gain and frequency response, the circuit comprising:
a first differential transistor comprising a source, gate, and drain;
a second differential transistor comprising a source, gate, and drain;
a first current source that is coupled to the source of the first differential transistor;
a second current source that is coupled to the source of the second differential transistor;
a first output impedance, comprising a first output resistor and a first shunt peaking inductor connected in series, such that the first output resistor is coupled between the drain of the first differential transistor and the first shunt peaking inductor, and the first shunt peaking inductor is coupled between the first output resistor and a supply voltage;
a second output impedance, comprising a second output resistor and a second shunt peaking inductor connected in series, such that the second output resistor is coupled between the drain of the second differential transistor and the second shunt peaking inductor, and the second shunt peaking inductor is coupled between the second output resistor and the supply voltage;
a first series inductor that is coupled between a first differential input of the C3MOS wideband data amplifier circuit and the gate of the first differential transistor; and
a second series inductor that is coupled between a second differential input of the C3MOS wideband data amplifier circuit and the gate of the second differential transistor;
a first capacitor that is coupled between the drain of the first differential transistor and the gate of the second differential transistor;
a second capacitor that is coupled between the drain of the second differential transistor and the gate of the first differential transistor; and
a switchable RC network, comprising a variable resistor and a variable capacitor connected in parallel, that is coupled between the source of the first differential transistor and the source of the second differential transistor.

19. The circuit of claim 18, wherein:
a value of the variable resistor of the switchable RC network is operable to control a boost between a low frequency gain and a high frequency gain of the C3MOS wideband data amplifier/equalizer circuit; and
a value of the variable capacitor of the switchable RC network is operable to control a peaking frequency of the C3MOS wideband data amplifier/equalizer circuit.

20. The circuit of claim 18, wherein:
the C3MOS wideband data amplifier/equalizer circuit is one stage of a cascaded plurality of stages in an upstream path or a downstream path in an integrated circuit; and
the integrated circuit is implemented within a receiver functional block of a communication transceiver.

* * * * *